(12) United States Patent
Knadle et al.

(10) Patent No.: US 6,962,642 B2
(45) Date of Patent: Nov. 8, 2005

(54) TREATING COPPER SURFACES FOR ELECTRONIC APPLICATIONS

(75) Inventors: Kevin T. Knadle, Endicott, NY (US); Anita Sargent, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 10/255,456

(22) Filed: Sep. 26, 2002

(65) Prior Publication Data

US 2004/0060729 A1   Apr. 1, 2004

(51) Int. Cl.[7] .......................... B32B 31/12; B32B 15/08
(52) U.S. Cl. ............... 156/273.9; 156/274.8; 156/275.7; 156/307.7; 156/327; 29/458
(58) Field of Search .................. 156/272.2, 273.9, 156/274.8, 275.7, 275.3, 307.7, 327; 29/458

(56) References Cited

U.S. PATENT DOCUMENTS

| | | | |
|---|---|---|---|
| 5,300,208 A | * | 4/1994 | Angelopoulos et al. ....... 205/50 |
| 5,368,717 A | * | 11/1994 | Gottesfeld et al. ............ 205/98 |
| 5,415,762 A | | 5/1995 | Allardyce et al. |
| 5,428,499 A | * | 6/1995 | Szerlip et al. ............... 361/328 |
| 5,528,000 A | | 6/1996 | Allardyce et al. |
| 5,543,084 A | | 8/1996 | Kinlen et al. |
| 5,556,518 A | | 9/1996 | Kinlen et al. |
| 6,046,268 A | | 4/2000 | Ochoa et al. |
| 6,146,704 A | | 11/2000 | Brodt et al. |
| 6,150,032 A | | 11/2000 | Yang et al. |
| 6,210,537 B1 | | 4/2001 | Murphy et al. |

FOREIGN PATENT DOCUMENTS

| | | | | |
|---|---|---|---|---|
| EP | 0413109 | | 2/1991 | |
| JP | 11162468 A | * | 6/1999 | .......... H01M 04/62 |
| JP | 11224008 A | * | 8/1999 | .......... G03G 15/16 |

* cited by examiner

*Primary Examiner*—Sam Chuan Yao
(74) *Attorney, Agent, or Firm*—Mark Levy & Associates; Lawrence R. Fraley

(57) ABSTRACT

A process by which high frequency printed wiring board construction can be fabricated using smooth copper surfaces. A conductive, thin film polymer is plated on smooth copper surfaces of a core lamination. The polymer can be selected from a group of materials consisting of polypyrrole, polyaniline, polythiophene, and combinations thereof. The conductive polymer promotes adhesion between the resin polymer of the laminate and the smooth copper surfaces.

15 Claims, 3 Drawing Sheets

Core Lamination 11   Core 18'   Composite Lamination 19'   Composite 22'

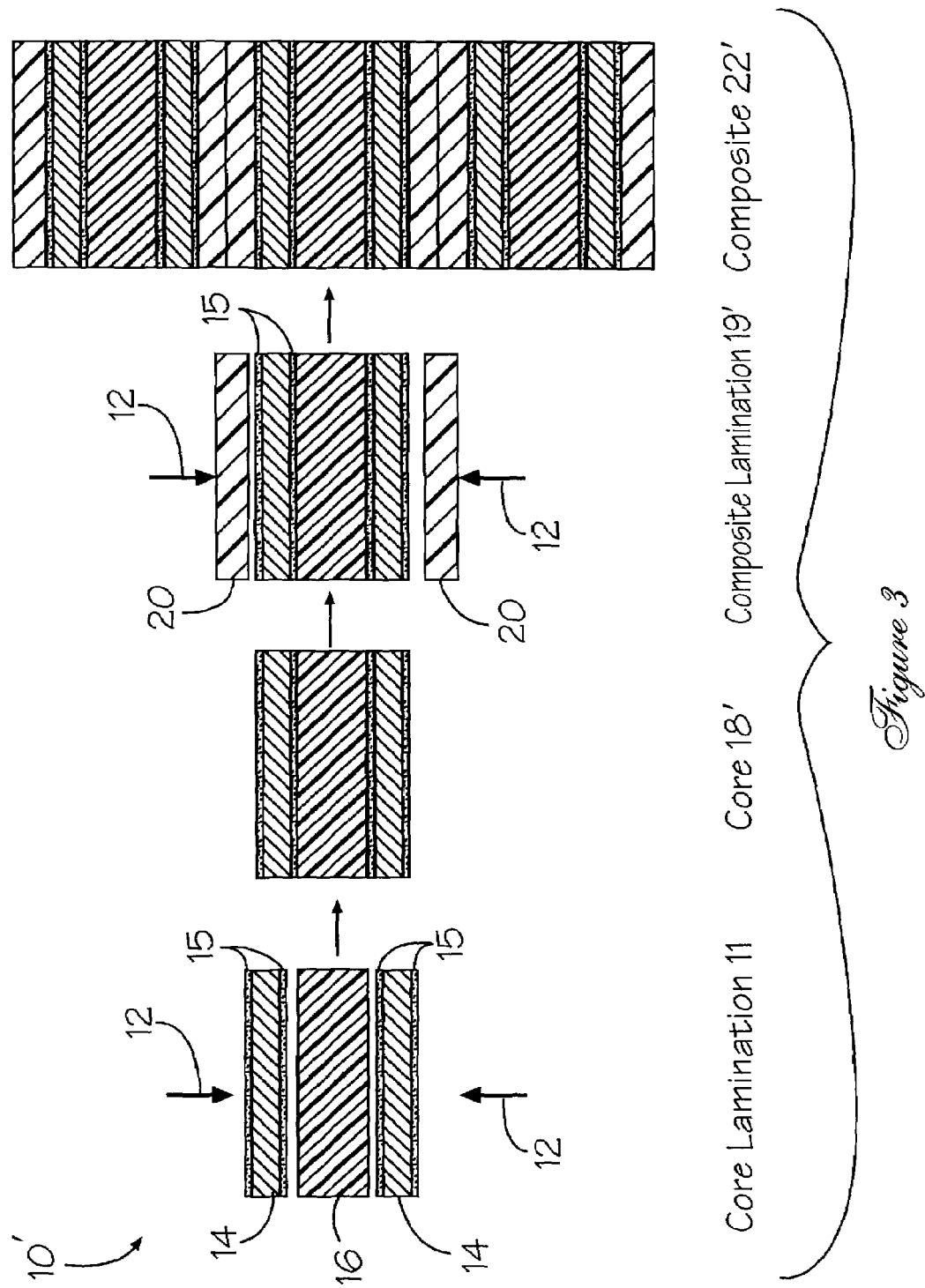

TREATING COPPER SURFACES FOR ELECTRONIC APPLICATIONS

FIELD OF THE INVENTION

The invention relates to electronic applications such as Printed Wiring Boards (PWBs), whose high radio frequencies require smooth copper surfaces and, more particularly, to a method of treating a smooth copper surface of a PWB with an organic material in order to promote laminate adhesion.

BACKGROUND OF THE INVENTION

Electronic applications such as Printed Wiring Boards (PWBs) operating with radio frequencies at or above the GHz range are driving the need for smooth copper features. This need is due to the well-documented "skin effect," where the electrical signals tend to take a path towards the outer surface of conductors as the frequency is increased. Therefore as frequency is increased, roughness on the surface of the copper can result in significantly higher resistive losses and longer effective line length, both of which contribute to higher conductive losses for the signal. Similarly, high frequency signal losses can also be affected by roughness in the voltage or ground plane that is referenced by the signal.

Unfortunately, conventional PWB processes are diametrically opposed to providing smooth copper surfaces. Conventional PWB processes purposely roughen the copper surfaces in order to provide adequate copper-to-laminate adhesion within the composite structure. The need for a bondable copper surface applies to all copper surfaces, including the inside surface of the foil used to make the initial copper-laminate cores, as well as the final signal or power artwork that is etched or plated on the core during circuitization. This roughening is normally part of an overall treatment that includes the introduction of organics to protect the copper and to promote adhesion. The overall goal of the roughening treatment is to produce a bondable copper surface (i.e., one that has reasonably good bond strength for the resin/laminate system).

The problem encountered with emerging high frequency applications is that the roughening treatment, while critical to the mechanical integrity of the structure, can greatly limit electrical performance, or force the use of relatively wide circuit lines which can greatly limit wiring density.

Adhesion promotion over smooth copper can be useful for other applications besides high frequency signal circuits. For example, a core comprising tightly spaced voltage planes surrounding an insulating material can be used for buried capacitance. In this case, the use of smooth copper on the interior of the voltage planes can facilitate tighter plate to plate spacing, and therefore higher capacitance, as well as better yield and reliability than is possible in a core constructed with interior copper surfaces that must be roughened.

DISCUSSION OF RELATED ART

In U.S. Pat. No. 6,210,537, issued to Murphy et al on Apr. 3, 2001, entitled METHOD OF FORMING ELECTRONICALLY CONDUCTING POLYMERS ON CONDUCTING AND NONCONDUCTING SUBSTRATES, a method is described wherein PWBs are directly metallized with electrically conductive polymers. The process requires the preparation of a monomer solution containing an electron acceptor, like silver nitrate. There is no teaching that this process promotes adhesion to smooth copper surfaces.

In U.S. Pat. No. 6,150,032, issued to Yang et al on Nov. 21, 2000, for ELECTROACTIVE POLYMER COATINGS FOR CORROSION CONTROL, an anti-corrosive polymer complex is described.

In U.S. Pat. No. 6,146,704, issued to Brodt et al on Nov. 14, 2000, for USE OF AQUEOUS POLYMER DISPERSIONS FOR PROTECTING METALLIC SURFACES AGAINST CORROSION, a composition is depicted wherein an aqueous polymer provides protection against corrosion. There is no mention of adhesion promotion for copper.

In U.S. Pat. No. 6,046,268 issued to Ochoa et al on Apr. 4, 2000, for ELECTRODE WITH ENHANCED ADHESION TO SUBSTRATES, a polymer coating for electrodes is illustrated that is sprayed as a powder onto a copper foil to form an adhesion/electrode layer. The polymer is preformed and is therefore not electrochemically polymerized on the substrate in situ, as described by this invention.

In U.S. Pat. Nos. 5,556,518 and 5,543,084, issued on Sep. 17, 1996 and Aug. 6, 1996 to Kinlen et al, respectively entitled ELECTROCOATING COMPOSITIONS AND METHODS THEREFOR and ELECTROCOATING COMPOSITIONS, methods of forming a coating on an electrically conducting surface are described. The purpose of the coating is for providing corrosion protection of a surface.

In U.S. Pat. No. 5,528,000, issued on Jun. 18, 1996 to Allardyce et al, for ELECTROPLATING PROCESS AND COMPOSITION, an electroplating process is illustrated wherein casting solutions of preformed, electrically conductive polymer particles are cast on a surface that is to be copper electroplated. This process is the reverse of the inventive process.

In U.S. Pat. No. 5,415,762, issued to Allardyce et al on May 16, 1995, entitled ELECTROPLATING PROCESS AND COMPOSITION, a process for electroplating a non-conducting substrate is shown, which uses a preformed suspension of a conductive polymer that is adsorbed upon the target surface. The process seeks to directly metallize PTH and vias. There is no teaching that the composition can be used to promote adhesion between copper and resin as taught by the invention.

In Japanese Patent No. JP7263862, applied for by Kitamura Naoya et al and published on Oct. 13, 1995, a conductive polymer is used as a ground conductive film on an outer layer of a substrate. The polymer is applied using a coating or casting process. A ground conductive film containing palladium is preferred.

In Japanese Patent No. JP5055746, applied for by Kamiya Masami and published on Mar. 5, 1993, a method of smoothing the copper foil for the purpose of reducing high frequency loss is described. A roughened copper surface is used to promote adhesion between the copper and resin having smaller and fewer peaks and valleys on the surface in order to lower transmission loss.

In European Patent No. EP0413109, applied for by Huang Wu-Song, James R. White, Jae M. Park, and Marie Angelopoulos and published on Feb. 20, 1991, a direct metallization process for fabricating a printed circuit board is described. Conducting polymers are used for plating through holes, blind holes, and vias.

In the IEEE Spectrum publication, "The Dawn of Organic Electronics," published in August 2000, pp. 29 through 34, organic semiconductors are used as light emitting devices for full-color displays. Conducting polymers are coated onto a base substrate, such as an electrode prior to depositing the organic semiconductor materials.

SUMMARY OF THE INVENTION

In accordance with the present invention, a high frequency printed wiring board (PWB) is fabricated that requires and uses smooth copper surfaces. The invention uses a conductive, thin film polymer that is plated on the smooth copper surfaces. The conductive polymer promotes adhesion with the resin polymer of the laminate that had been previously provided by processes that involve roughening of the copper surfaces. The conductive polymer bonds with the copper via an electrostatic bond.

In other words, this invention provides a method of treating a smooth copper surface with an organic material layer to promote laminate adhesion without the need for roughening. Furthermore, in the absence of laminate adhesion concerns, this organic layer acts as a surface protector in its own right.

A conductive, thin film polymer is plated on a copper surface. The polymer can be selected from a group of materials consisting of polypyrrole, polyaniline, polythiophene, and combinations thereof. This method can be used as part of other process steps in the manufacture of PWBs in order to resolve other problems. The conductive polymer promotes adhesion with the resin polymer of the laminate and additionally bonds with the copper via an electrostatic bond. Initial experiments using polypyrrole as the polymer material deposited onto smooth copper cores resulted in a bond strength of about 2.5 lbs. This value, when compared to 1 to 1.5 lbs. for untreated smooth copper and about 3 to 3.5 lbs. for copper with a roughened surface, suggests an improvement in copper adhesion without encouraging roughening of the copper surface.

The conductive polymer layer itself has a negligible effect on the integrity of high frequency signals because the method of electrochemically preparing the polymer by nature creates a conductive material which is still sufficiently lower than the conductivity of copper whereby it is invisible to the signals; and, as needed, the polymer may be treated to further alter, or lower, the conductivity. Treatment to reduce conductivity includes electrochemical reduction by sufficiently negative applied potentials or reducing currents to expel counter-anions that originally impart ionic and electronic conductivity to the polymer chains, and chemical treatment to either reduce the film or overoxidize the film to render the polymer sufficiently nonconductive. In the case that a higher film conductivity is desired, the film can be soaked in an ionic, aqueous medium consisting of mobile anions known to positively influence conductivity of such polymers.

Therefore, the advantages of this method include electrochemically growing the conducting polymers on a copper or other metal surface without requiring that the copper or other metal surface be roughened; and expelling counter-anions by reducing the conductivity of the applied polymers by subjecting them to a sufficient electrochemical potential.

It is an object of this invention to provide a means whereby printed wiring boards can be laminated with smooth copper surfaces.

It is another object of the present invention to provide smooth, copper-surfaced laminates for fabricating high frequency printed wiring boards.

It is yet another object of the present invention to employ conductive polymer materials as above-mentioned adhesion promotion layers in printed circuit board manufacturing.

BRIEF DESCRIPTION OF THE DRAWINGS

A complete understanding of the present invention may be obtained by reference to the accompanying drawings, considered in conjunction with the subsequent detailed description, where:

FIG. 3 shows a stepped process for fabricating printed wiring board constructions in accordance with the present invention.

Figure 1:
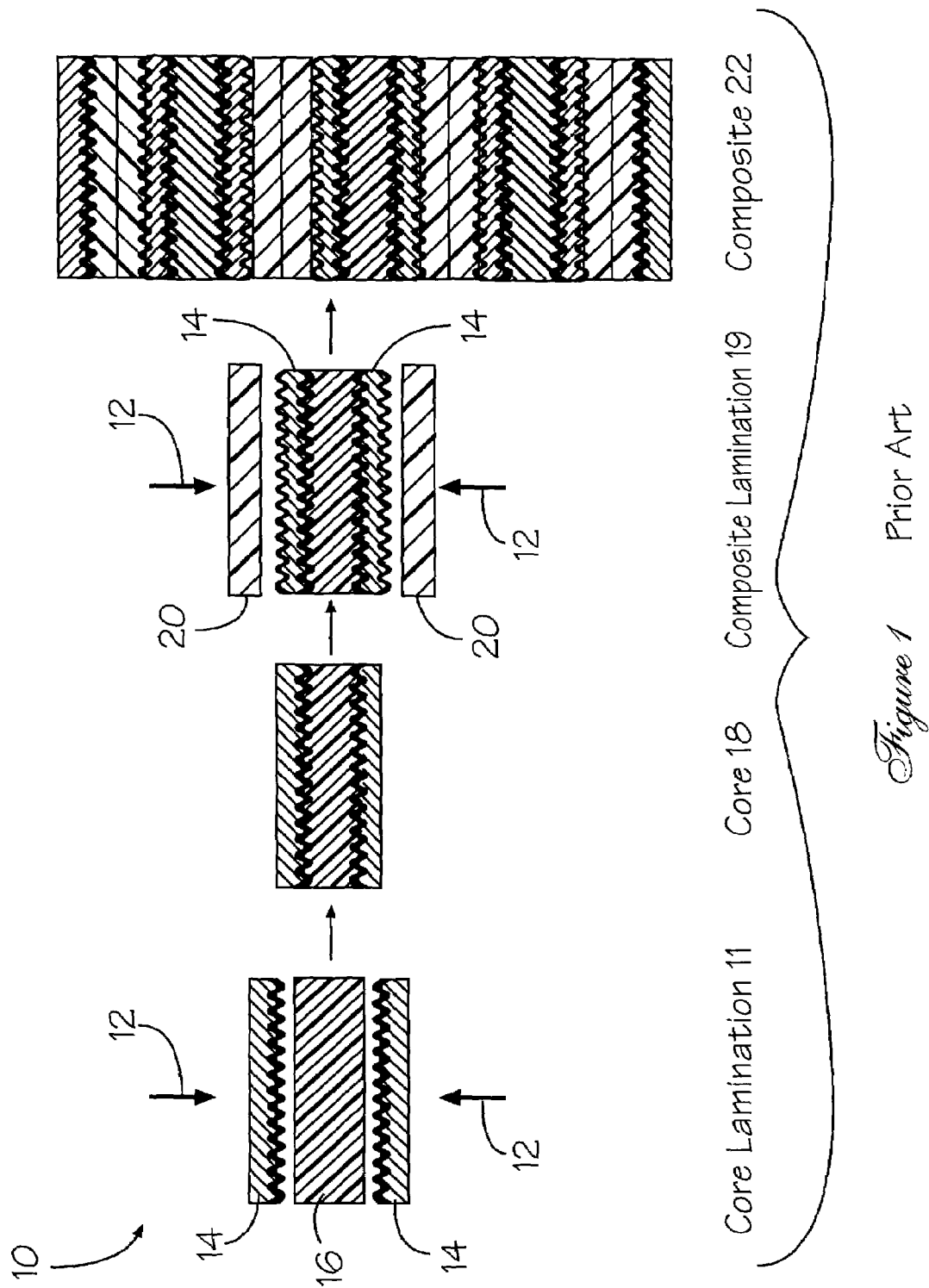
FIG. 1 illustrates a prior art, stepped process for the fabrication of a typical printed wiring board construction.

For purposes of brevity and clarity, like components and elements of the process of this invention will bear the same designations or numbering throughout the figures.

DESCRIPTION OF THE PREFERRED EMBODIMENT

Generally speaking, the invention features a process whereby high frequency printed wiring board construction can be fabricated using smooth copper surfaces. A conductive, thin film polymer is plated upon smooth copper surfaces of the foil copper used in the construction of signal or voltage cores. The polymer can be selected from a group of materials consisting of polypyrrole, polyaniline, polythiophene, and combinations thereof. The conductive polymer promotes adhesion between the resin polymer of the laminate and the smooth copper surfaces. Various electrochemical and chemical means may be used to oxidatively polymerize a conducting polymer onto a metal substrate; these methods are known in the scientific literature. However, the unique application of the conducting polymer to reduce the "skin effect" phenomena on printed circuit boards requires certain practical considerations and methods.

The polymer may be electrochemically polymerized from neutral, basic or acidic aqueous media consisting of an electrolyte containing the desired counteranion (e.g., NaCl whereby Cl would become the mobile counteranion incorporated within the polymer matrix). The choice of growing media depends on the metal substrate employed for signal lines. To avoid the generation of a roughened copper surface due to copper dissolution during the oxidative polymerization of the conductive polymer, typically encountered in other oxidative surface roughening treatments, the polymer may be grown preferentially from a neutral or basic, non-chloride containing media. Preferentially, the aqueous electrolyte will contain highly mobile ionically-conducting salts such as $NaNO_3$ or $KNO_3$ in an alkaline or neutral electrolyte. The presence of hydroxide ion encourages over-oxidation of the growing polymer film, resulting in lower film conductivity, which is desirable to avoid further influence of film conductivity on signal response.

A solution of about 0.01 M to about 0.05 M monomer is dissolved in the desired electrolyte. The electrolyte may be aqueous or nonaqueous. The preferred embodiment of the disclosed process employs an aqueous solution of the monomer with 0.1 M monomer and 0.1 M $NaNO_3$ in aqueous solution being the most preferred embodiment. The substrate (e.g., copper foil) is placed into the monomer solution mixture via suitable fixturing means. For electrochemical oxidative polyermization, the substrate will act as the anode. A suitable cathode is a noble metal such as platinum or gold.

For electrochemical polymerization, either a current can be applied to the anode (galvanized deposition) or an oxidizing potential may be applied to the anode (potentiostatic or cyclic potential deposition). A reference electrode (e.g., saturated calomel or Ag/AgCl) is required when potentiostatic methods are used for depositing the polymer.

The thickness of the deposited conductive polymer can be changed by altering the electrolysis time and deposition parameters. The electronic properties of the resulting polymer can be changed by altering solution composition as well as the deposition conditions.

Now referring to FIG. 1, a prior art process 10 is shown in stepped sequence for the fabrication of PWBs. The process 10 comprises the first step of forming a core 11 by laminating together (arrows 12) roughened copper foils 14 with a pre-preg layer 16, as shown. After the core 18 has been formed, as shown in the second step, the outer copper surfaces of the newly fabricated core 18 are then personalized on the top and bottom as signal and/or voltage planes through a process of circuitization which typically involves patterning with a resist to cover desired conductors, removal of unwanted copper with a copper etchant, and then stripping of the resist. A composite lamination 19 is performed in the third step by laminating together (arrows 12) one or more cores as formed in the second step, which include outer copper layers 14 that have been externally roughened as part of an oxide or oxide-replacement process, with additional layers of pre-preg 20 interleaved above and below each core. Composite lamination 19 typically also includes a layer of roughened copper foil placed at the very top and bottom of the composite, with additional layers of pre-preg between the copper foil and adjacent cores. The final composite 22 illustrated in the fourth step is an example of a composite constructed from three cores and two outer copper foils, with two layers of pre-preg between each layer of copper, where all adhered copper surfaces have been roughened to promote adhesion.

Figure 2:
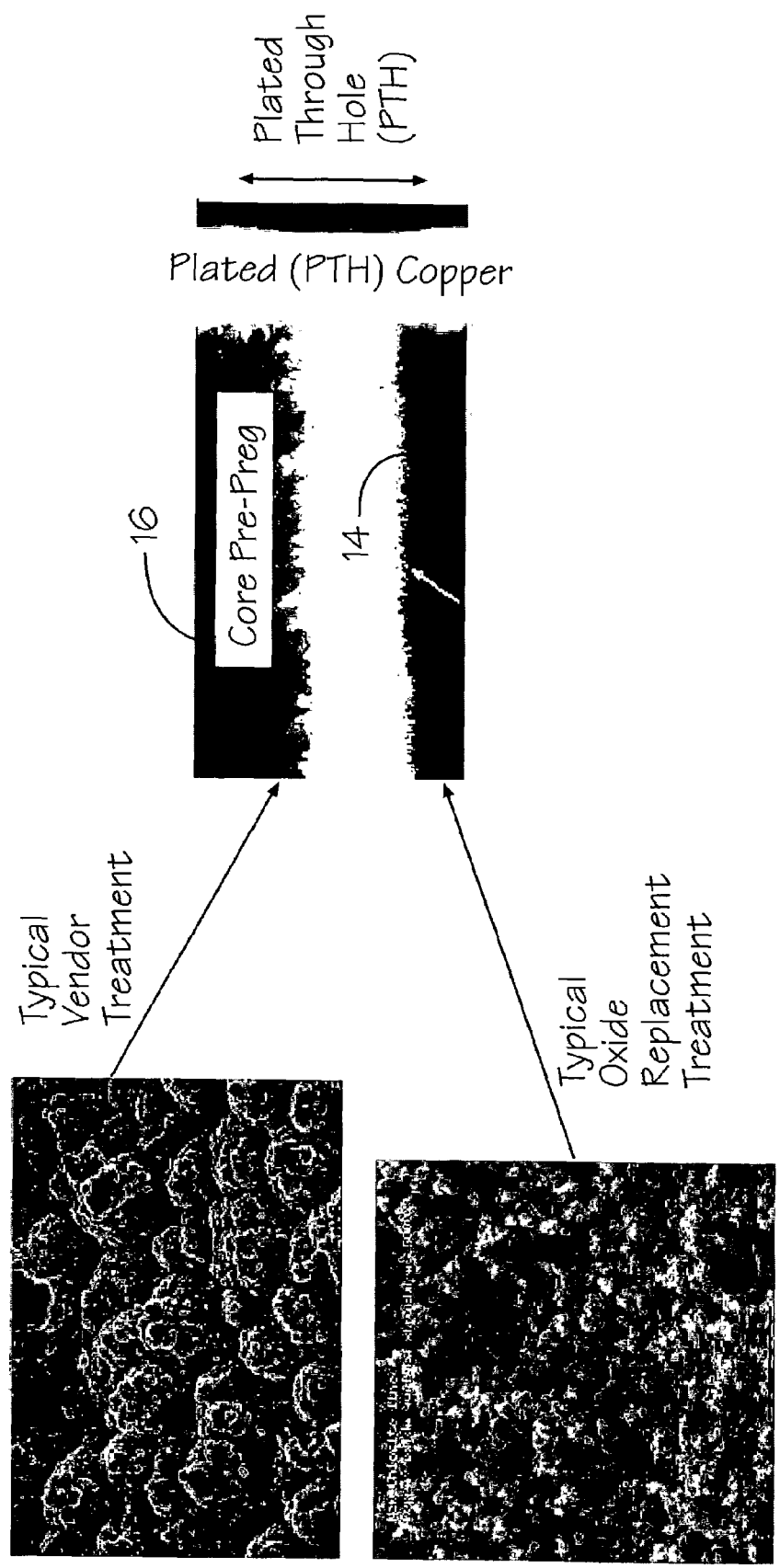
FIG. 2 depicts photographic views of cross-sectional micrographs of an example printed wiring board construction illustrating the roughness typically employed to promote adhesion between the copper and resin laminate layers.

Referring to FIG. 2, SEM and cross-sectional micrographs of the PWB fabricated in accordance with the prior art method illustrated in FIG. 1 is shown. The micrographs show the roughened surfaces that promote adhesion.

Referring to FIG. 3, a process 10' is shown for fabricating the PWB using smooth copper surfaces in accordance with this invention. The copper foils 14 are electroplated with conductive polymer 15 prior to laminating them with the pre-preg 16 in order to form the core 18'. The polymer can be selected from a group of materials consisting of polypyrrole, polyaniline, polythiophene, and combinations thereof. The conductive polymer 15 promotes adhesion of the copper foil 14 with the resin polymer of the pre-preg 16, eliminating the need for processes that involve roughening of the copper surfaces as the means for adhesion promotion, as shown for prior art in FIG. 1. After plating the polymer 15 onto the copper, the foil 14 can be treated to expel counteranions if required for optimum electrical performance. Lamination of the copper and pre-preg to form a core completes the first step.

The outer copper surfaces of the newly fabricated core 18' are then personalized on the top and bottom as signal and/or voltage planes through a process of circuitization which typically involves patterning with a resist to cover desired conductors, removal of unwanted copper with a copper etchant, and then stripping of the resist. The conductive polymer layer 15 previously electroplated on the exterior surfaces of the copper is covered by resist during this circuitization process, and is not removed or affected by any part of the circuitization process, including the final step of stripping the resist. The newly fabricated and personalized core 18' with conductive polymer on exposed outer surfaces, the second step, is then subjected to further lamination with sheets of pre-preg 20 as part of composite lamination 19', the third step. As with the third step of FIG. 1, the process of composite lamination 19' in FIG. 3 can involve more than one core 18' with additional layers of pre-preg 20 interleaved above and below each core. Composite lamination 19' would also typically include a layer of copper foil placed at the very top and bottom of the composite, with additional layers of pre-preg between the copper foil and adjacent cores, where at least the interior surfaces of the top and bottom foil are electroplated with the conductive polymer 15 to promote adhesion to the adjoining pre-preg. The final composite 22' illustrated in the fourth step is an example of a composite constructed from three cores and 2 outer copper foils, with 2 layers of pre-preg between each layer of copper, where all adhered copper surfaces have been left smooth and electroplated with a conductive polymer layer to promote adhesion.

Alternately, the use of a conductive polymer as an adhesion promoter over smooth copper as illustrated in FIG. 3 may be used in combination with the prior art of FIG. 1 depending on the specific use, location of critical high frequency circuits and their reference planes, and overall board construction. For example, a core may be constructed according to the first step (FIG. 1) with roughened copper on the interior side of the copper foil, but then treated after core lamination on the outside copper surfaces according to this invention, leaving the outer surfaces of the copper smooth. Conversely, the core can be constructed with the interior surfaces treated prior to core lamination according to this invention with smooth copper, and the exterior copper surfaces roughened after core lamination as part of conventional processing.

In addition, this invention can be applied to more constructions other than the typical two-layer core. For example, voltage planes personalized as single sheets of copper foil can be readily treated according to this invention. In this case, electroplating of the conductive polymer can be done before or after personalization.

The conductive polymer promotes adhesion of the copper foil 14 with the resin polymer of the pre-preg 16 and additionally bonds with the copper via an electrostatic bond. Initial experiments used polypyrrole as the polymer material deposited upon smooth copper cores. This resulted in bond strength of about 2.5 lbs., which can be compared to 1 to 1.5 lbs. for untreated smooth copper, and about 3 to 3.5 lbs. for copper with a roughened surface. The conductive polymer has a negligible effect on the integrity of high frequency electrical signals because surface roughness is not required; the conductivity of the polymer facilitates electroplating but is still sufficiently lower than the conductivity of copper whereby it is invisible to the signals; and, as needed, the polymer may be treated to further lower conductivity. The conductive polymer can be electrochemically treated to expel counter-anions, which originally impart ionic and electronic conductivity to the polymer chains.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of forming an electrical composite suitable for high-frequency applications, the steps comprising:
   a) electroplating an unroughened copper foil with an organic, adhesion-promoting, conductive polymer comprising at least one of the materials: polypyrrole, polyaniline, polythiophene, and combinations thereof; and
   b) laminating two layers of said plated copper foil onto opposing major surfaces of a single-ply intermediate pre-preg layer to form a laminated core structure such that each plated copper foil is contiguous to said pre-preg layer.

2. The method of forming an electrical composite suitable for high-frequency applications as recited in claim 1, wherein said electroplating step (a) comprises electrochemically polymerizing an aqueous media comprising highly mobile, ionically-conducting salts onto said unroughened copper foil.

3. The method of forming an electrical composite suitable for high-frequency applications as recited in claim 2, wherein said aqueous media is non-acidic and absent chlorides.

4. The method of forming an electrical composite suitable for high-frequency applications as recited in claim 3, wherein said aqueous media comprises a hydroxide ion.

5. The method of forming an electrical composite suitable for high-frequency applications as recited in claim 1, the steps further comprising:
   c) prior to said laminating step (b), expelling counteranions from at least one of said organic conductive polymer layers.

6. The method of forming an electrical composite suitable for high-frequency applications as recited in claim 5, wherein said organic, conductive polymer comprises at least one of the materials: polypyrrole, polyaniline, polythiophene, and combinations thereof.

7. The method of forming an electrical composite suitable for high-frequency applications as recited in claim 1, wherein said plating step (a) comprises at least one of the sub-steps:
   i) controlling a deposited thickness of said organic, conductive polymer during said plating operation; and
   ii) controlling electrical conductivity of said organic, conductive polymer during said plating operation.

8. The method of forming an electrical composite suitable for high-frequency applications as recited in claim 1, the steps further comprising:
   d) laminating an additional layer comprising copper foil and pre-preg to one side of said core.

9. The method of forming an electrical composite suitable for high-frequency applications as recited in claim 8, wherein said copper foil on said additional layer comprises unroughened copper foil having an organic, conductive polymer plated upon a surface thereof.

10. The method of forming an electrical composite suitable for high-frequency applications as recited in claim 9, the steps further comprising:
    e) prior to said laminating step (c), expelling counteranions from said organic conductive polymer layer.

11. The method of forming an electrical composite suitable for high-frequency applications as recited in claim 9, wherein said plating step (a) comprises electroplating.

12. The method of forming an electrical composite suitable for high-frequency applications as recited in claim 11, wherein said electroplating step (a) comprises electrochemically polymerizing an aqueous media comprising highly mobile, ionically-conducting salts onto said unroughened copper foil.

13. The method of forming an electrical composite suitable for high-frequency applications as recited in claim 12, wherein said aqueous media is non-acidic and absent chlorides.

14. The method of forming an electrical composite suitable for high-frequency applications as recited in claim 13, wherein said aqueous media comprises a hydroxide ion.

15. The method of forming an electrical composite suitable for high-frequency applications as recited in claim 14, wherein said plating step (a) comprises at least one of the sub-steps:
    i) controlling a deposited thickness of said organic, conductive polymer during said plating operation; and
    ii) controlling electrical conductivity of said organic, conductive polymer during said plating operation.

* * * * *